United States Patent [19]

Peterson

[11] 3,899,720

[45] Aug. 12, 1975

[54] PACKAGE FOR MICROWAVE INTEGRATED CIRCUITS

[75] Inventor: Noel C. Peterson, Severna Park, Md.

[73] Assignee: Westinghouse Electric Corporation, Pittsburgh, Pa.

[22] Filed: Sept. 14, 1973

[21] Appl. No.: 397,486

[52] U.S. Cl. ........ 317/101 D; 174/525; 174/DIG. 3; 317/101 DH; 333/84 M; 357/74

[51] Int. Cl.² .......................................... H02B 1/00

[58] Field of Search ...................... 174/525, DIG. 3; 317/101 CP, 234 G; 333/84 M; 357/74, 75

[56] References Cited

UNITED STATES PATENTS

| | | | |
|---|---|---|---|
| 3,628,105 | 12/1971 | Sakai et al. | 174/DIG. 3 X |
| 3,715,635 | 2/1973 | Michel et al. | 174/DIG. 3 X |
| 3,746,932 | 7/1973 | Hogan et al. | 174/525 X |
| 3,786,375 | 1/1974 | Sato et al. | 174/DIG. 3 X |

*Primary Examiner*—Darrell L. Clay
*Attorney, Agent, or Firm*—J. B. Hinson

[57] ABSTRACT

A flat package is provided for holding microwave integrated circuits. A completely inorganic assembly of ceramic and metal materials is fabricated from thin sheet materials and hermetically sealed. Using the "green tape" process, a planar base, spacer and frame are provided in a rectangular package provided with a cutout portion adapted for containing RF electrical circuit components mounted on a standard dielectric circuit board. The dielectric package contains metallized edge portions on an RF terminal for electrically connecting the package to a standard microstrip having a ground plane. DC and bias leads are provided on a separate edge portion of the flat pack.

15 Claims, 9 Drawing Figures

PACKAGE FOR MICROWAVE INTEGRATED CIRCUITS

BACKGROUND OF THE INVENTION

1. Field of the Invention

This invention relates to dielectric packages for microwave circuits. In particular, it provides a flat package suitable for hermetic sealing of circuit boards used in electrical circuits which operate at high frequencies. Common radio frequencies (RF) used in UHF and microwave systems in the 800 to 1200 megaHertz (mHz) range require package assemblies for transistors, diodes, capacitors, resistors and other components mounted on a circuit board or designed as part of an integrated circuit. Proper operation of transistors and other components at high frequencies require special considerations in design of a package for holding the electrical circuits in operation. Such assemblies must maintain heat dissipation, ease of assembly, hermetic seal and have minimum lead lengths for RF inputs as well as convenient connections for DC or bias leads to the circuit. It is desirable to have high frequency packages adapted for mounting in distributed line circuits, particularly microstrip and stripline types of circuits.

2. Description of the Prior Art

Packages or housings for electrical assemblies are known which have materials with electrically insulating and thermally conductive properties. Microwave packages frequently have hollow spacings in dielectric materials forming cavities in resonance applications. Typical prior art microwave packages comprise dielectric ceramic materials such as aluminum oxide ($Al_2O_3$) or beryllium oxide (BeO). These dielectric structures can be coated with a film of electrically conductive metal, such as Ta, Ag, Au, Cu or Mo. These dielectric materials can be bonded by soldering the metallized portions together, by brazing or thermal compression techniques. Such packages may be hermetically sealed to exclude air or other atmospheres by fusion or other sealing methods. Typical high frequency packages are disclosed by Taylor in U.S. Pat. No. 2,880,383, by Gregory et al in U.S. Pat. No 3,211,922, by Carley in U.S. Patent No. 3,611,059, by Louvel in U.S. Pat. No. 3,673,470, and by Van Iperen et al in U.S. Pat. No. 3,701,049. In typical semiconductor devices for use in high frequency circuits, e.g. junction transistors, variable capacitors, etc., careful design of the package configuration is necessary to provide proper electrical connection to the collector, base and emitter leads, for instance. Economical structures providing leads with good electrical properties have been difficult to obtain.

Current trends in electronic systems have created a demand for high density packaging that meets severe performance standards. A large quantity of such packages is required for phased array radar antenna systems, data processing systems with high bit rate, and other radar and communications equipment demand mass producible microwave packages having high reliability and compatibility with transmission line circuitry. Flatpacks can be made of thin, fired ceramic materials.

BRIEF SUMMARY OF THE INVENTION

A novel hermetically sealable package has been designed for holding a flat microwave circuit board. This flatpack assembly is made of inorganic materials including ceramic and metal elements. A rectangularly shaped planar base of inorganic dielectric material such as alumina has deposited thereon a film of metal for bonding to the circuit board. A thin spacer of inorganic dielectric material having a peripheral shape corresponding to the planar base is provided with terminal end portions adapted for electrical connection to a microstrip line and DC or bias leads. The planar spacer has a rectangular cutout portion adapted for receiving a standard electrical circuit board. A rectangular frame having a substantially thicker dimension than the spacer is bonded to the flat package. The frame has a rectangular cutout larger than the spacer cutout for insertion of the electrical circuit board and for containing components. A metal plate is bonded to the top of the frame thereby forming an hermetically sealed space within the flatpack.

A feature of this invention is the provision of notches or recessed openings along the inner surface of the spacer cutout to permit removal of the circuit board after assembly.

Another feature of this invention is the provision for connecting the RF terminals from package to package, or from package to parent board, using constant impedance microstrip transmission line. There is no need to transform into coaxial line to make interconnections.

A further feature of the invention is the provision of DC or low frequency connecting leads isolated from the microstrip leads and conveniently available for assembly with edge connectors facilitating connections to individual or plural packages.

Inorganic components of the package can be fabricated from thin sheet materials of ceramic with a polymeric binder which is fired to produce the dielectric materials.

Thicknesses in the various views are shown exaggerated to better display the invention.

DESCRIPTION OF THE PREFERRED EMBODIMENTS

Figure 1:
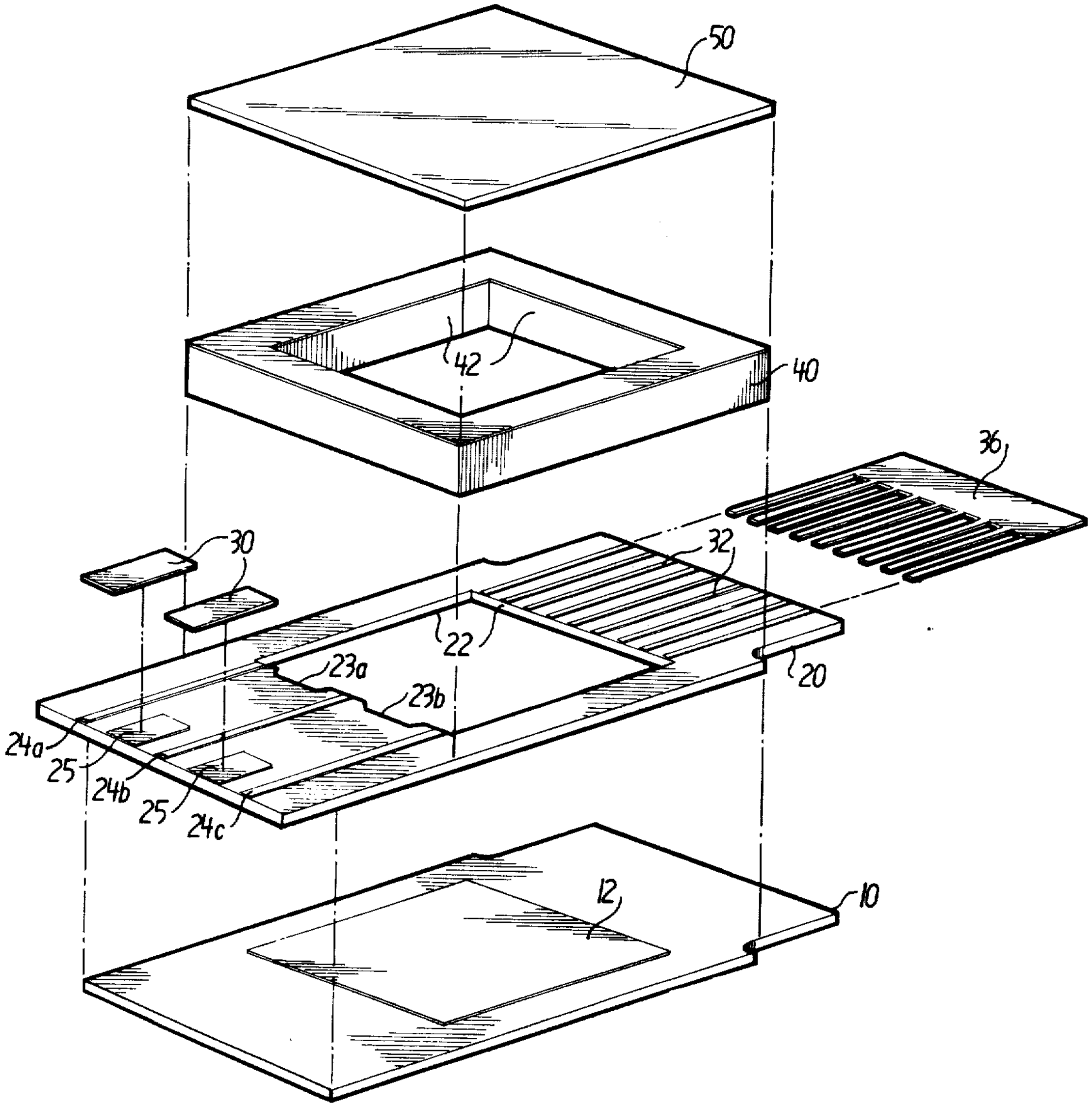
FIG. 1 is an exploded isometric view of the flat package.

Referring to FIG. 1 of the drawings, there is depicted an exploded isometric view of a flat package according to the invention, showing individual components aligned vertically for assembly. A rectangular ceramic base member 10 is provided with metallized portion 12 to permit soldering the base to the circuit substrate.

The metal surface 12 also shields the circuit in use. The metallized area is larger than the corresponding cutout above. Adjacent to the base is a thin ceramic spacer 20 having a peripheral shape corresponding to the base. The spacer is longer than the base so that it overhangs the base on the left end. The spacer has a rectangular cutout portion 22 having a plurality of notched areas 23*a* and 23*b*. On the left-hand edge portion of the spacer a plurality of RF electrical leads 24*a*, 24*b* and 24*c* are provided for connecting the packaged circuit to an RF parent board or to another package. This first terminal end portion of spacer 20 extends outwardly from the base 10. Cutout portion 22 corresponds approximately in shape and thickness to a standard electrical circuit board used in microwave applications. Leads 24*a*, 24*b* and 24*c* are provided by metallizing the spacer 20. Also provided on the RF connector edge portion are metallized areas 25 which are used for bonding separate metal tabs 30 at the edge of the spacer. The tabs 30 extend outwardly from the edge of the package to provide means for mechanically attaching the package to a parent board, chassis or the like. On a second separate edge portion of the rectangular spacer opposite the RF connector edge portion is provided a series of metallized electrical leads 32. These leads may be spaced closely in parallel to provide a number of connections for DC bias, or other voltages. An optional metal comb 36 is provided as a means for connecting the leads 32 to other circuits or to other flat packs. As is well known, the solid end portion of the comb is removed to provide individual leads once the comb structure is suitably assembled with the package, either by attachment to the leads 32 or by being directly affixed to the spacer 20 in lieu of the leads 32. A rectangular ceramic frame 40 is provided with an aligned cutout portion 42, which is slightly larger than cutout portion 22 of spacer 20 to permit the insertion of the circuit board through the frame. The thickness of the frame is approximately four times the thickness of the spacer. Frame 40 is metallized on the top surface for bonding. A rectangular metal top plate or lid 50, having a rectangular shape corresponding to the frame, is provided for bonding to the package. Metal top plate 50 also shields the circuit in use. The individual component ceramic and metal parts are aligned to form an enclosed space for containing an electrical circuit board and electrical components.

Figure 2A:
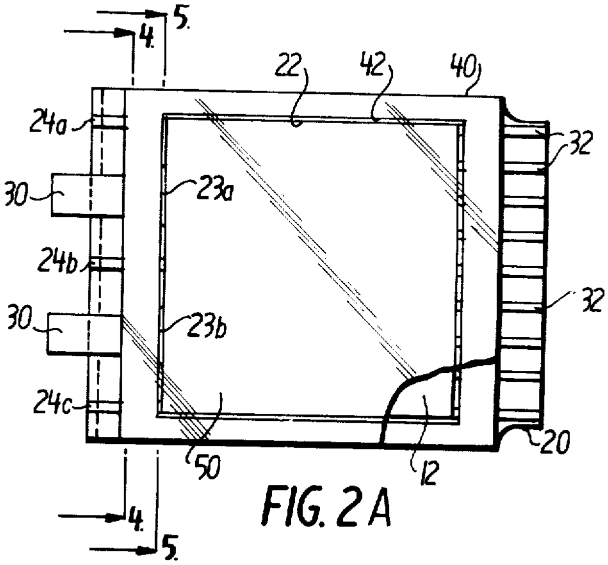
FIG. 2A is a plan view of the package, with the cover 50 partially broken away.

Referring now to FIG. 2A, there is shown a top plan view of a typical flat package constructed in accordance with the invention with the top plate 50 partially broken away to show the interior surfaces. Metallized surface 12 of base 10 can be seen through the cutout portions 22 and 42. Planar spacer 20 is provided with a plurality of electrically conductive metal connector film strips 24*a*, 24*b* and 24*c* on the upper surface extending from the left-hand terminal edge of the flatpack inwardly to the inner edge of cutout portion 22. The interior edge of the cutout 22 includes at least one recessed opening, such as notched areas 23a and/or 23b. Metal tabs 30 are attached to the surface of the planar spacer 20 to provide means for mechanically attaching the package to an adjoining structure. Ceramic frame 40 overlies the spacer 20 and is aligned in the peripheral dimensions. Cutout 42 is slightly larger than cutout 22 in order to permit attachment of the circuit board to the exposed ends of the film strips 24 and 32. A plurality of spaced parallel DC or bias leads 32 extends from a second, opposite terminal edge on the right-hand side of the flatpack inwardly to the inner edge of cutout 22 on spacer 20.

Figure 2B:
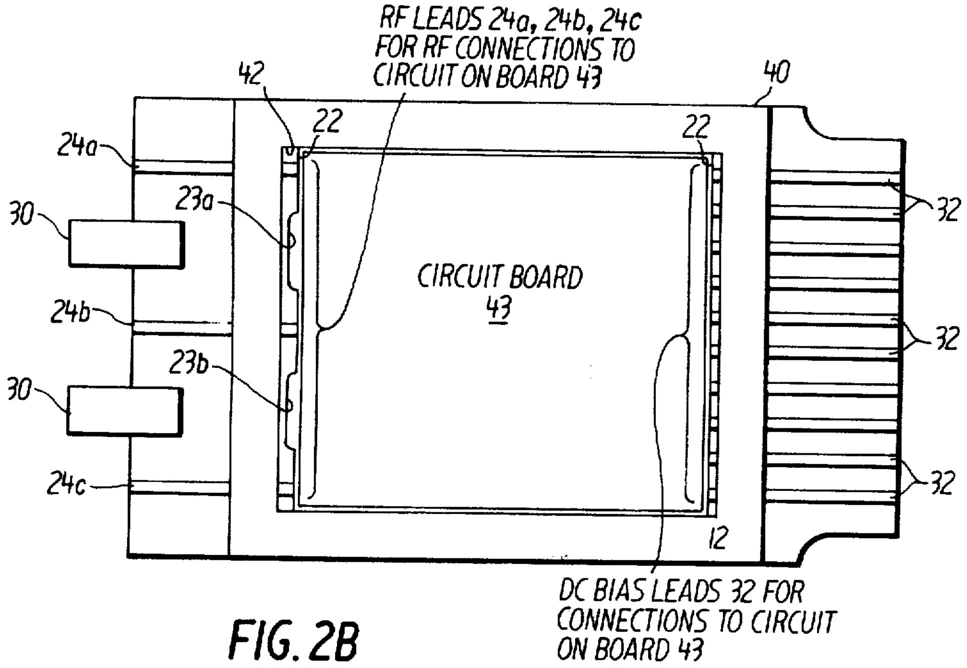
FIG. 2B is a plan view of the package of FIG. 2 for illustrating a circuit board mounted within the package.

In FIG. 2B the package is shown substantially as in FIG. 2 but with the top plate 50 removed to disclose a circuit board 43 received within the cutout portions 22 and 42 and mounted on the metallized layer 12 as aforedescribed. Numerous types of circuits, as is well known, may be mounted on circuit boards, and hence the particular type of circuit mounted on the circuit board 43 is not limiting in any manner with respect to the present invention. Moreover, packages in accordance with the invention may be constructed in as small or large a dimension as required, e., 2 inches by 2 inches, thereby to accommodate substantially any desired circuit board.

A significant feature of the package of the invention is the provision for applying both RF signals and DC or low frequency signal levels such as the above discussed bias voltages, or trigger pulses or the like to the active elements on the circuit board by means of the corresponding Rf and DC leads on the opposite, terminal end portions of the spacer.

Figure 3:
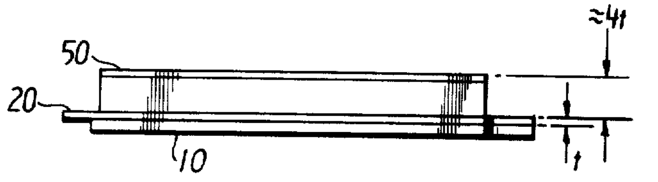
FIG. 3 is a side elevation view of the package.

In FIG. 3, a side elevational view of the example flat package is shown. Planar base 10, spacer 20, frame 40 and metal plate 50 are aligned on rectangular corners on the right-hand side. Base 10 extends outwardly from the frame on the left-hand side and spacer 20 extends further out to form the RF terminal edge of the flatpack. FIG. 3 is shown with exaggerated thicknesses in order to better display the features of the invention. Planar spacer 20 has a thickness *t*, which is typically about 0.025 inches. Frame 40 has a thickness of about 4*t*, or about 0.10 inches. For most microwave applications, the spacer should be about 0.010 to 0.075 inches thick and is a parameter in the circuit design. The thicknesses of the metal plate 50 and base 10 are not critical but should be sufficiently thin to permit the desired package density for a plurality of flatpacks aligned on a parent board. A plate thickness of about 0.015 to 0.025 inches is satisfactory.

Figure 4:
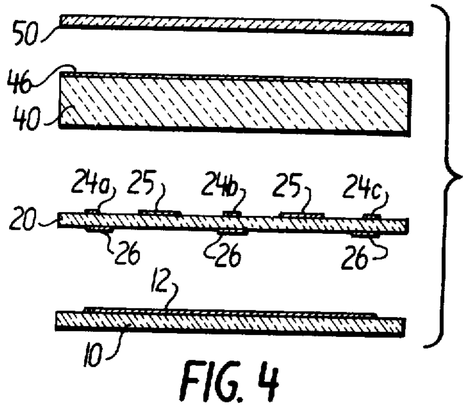
FIG. 4 is an exploded vertical cross-sectional view along lines 4—4 of FIGS. 2 and 3.

In FIG. 4, the package is shown in an unassembled exploded view in order to disclose the metallized layers used in making electrical connections and in providing mechanical attachment of the ceramic pieces. FIG. 4 is a vertical cross-sectional view across the package adjacent the RF terminal edge portion. Spacer 20 is joined to the package base 10 by the green tape ceramic firing process. A plurality of electrical leads 24*a*, 24*b* and 24*c* on the top surface of spacer 20 are provided. On the lower side of spacer 20, there are metallized areas 26 which run underneath and extend the length of the RF strips 24. These metallized areas 26 are at least 3 times as wide as strips 24a, 24b and 24c each forms the corresponding ground plane of the microstrip, and will connect electrically to metallized area 12 in assembly. The ground plane may be extended by metallizing substantially all of the lower side of spacer 20 or any part greater than areas 26. Other metallized portions 25 extending partially in from the periphery of the spacer on the upper side are provided for attaching metal tabs 30 to the flatpack. Ceramic frame 40 is metallized on top layer 46 for bonding to top plate 50.

Figures 5, 6:
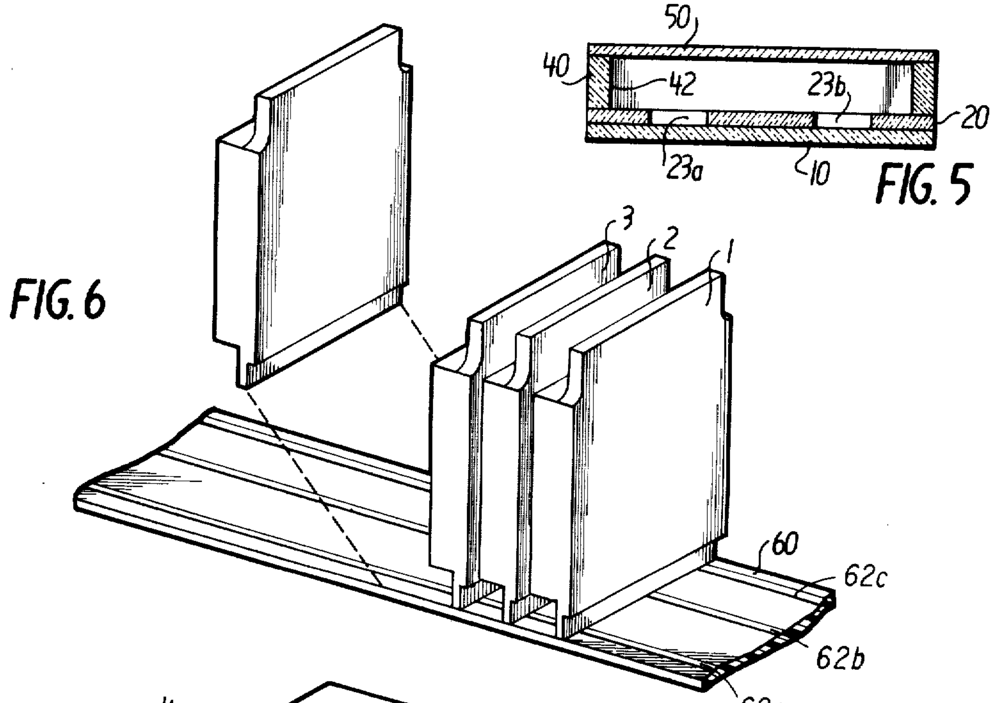
FIG. 5 is a vertical cross-sectional view along lines 5-5 of FIGS. 2 and 3.
FIG. 6 is an isometric representation showing vertical installation of flatpacks on a parent RF line.

One feature of the invention provides for removal of an electrical circuit board. Prior art devices have been deficient in not providing a means for disassembling components after fabrication. Referring to FIG. 5, a vertical cross-sectional view of the assembled package is shown, with the top plate 50 removed for access to the interior of the package. With cutout 42 being larger than cutout 22, access is had through notches or recessed openings 23*a* and 23*b*. A circuit board may be removed from its position in the flatpack by hooking it through either recessed opening. A preferred method is to direct a small stream of hot pressurized air or inert gas under the circuit board through notches 23*a* or 23*b* while the assembly is heated to melt solder connections. This lifts out the circuit board without damage.

Referring now to the isometric representation of FIG. 6, a plurality of flat packages 1, 2 and 3 is shown mounted on a parent board 60 having microwave strips 62*a*, 62*b* and 62*c*. This arrangement is useful for providing a mechanical support and interconnecting RF line. The domino-type stack of flat packages provides high circuit density. Mechanical attachment is provided by inserting metal tabs 30 (not shown in FIG. 6 but seen in FIGS. 1 and 2) through the parent board and bending, welding or soldering the tabs to secure the flatpack.

Figure 7:
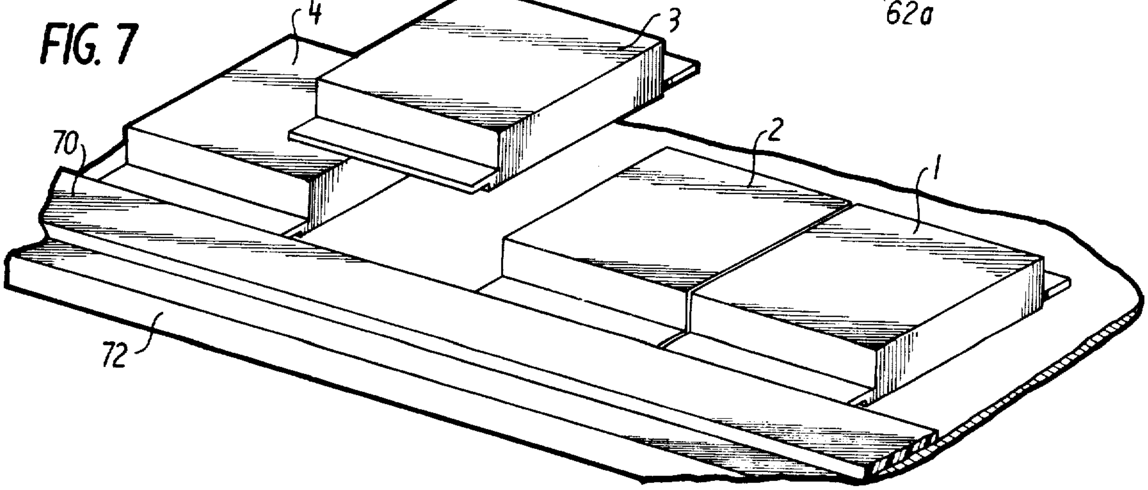
FIG. 7 is an isometric representation of horizontally installed flatpacks on a parent board.

In schematic FIG. 7, an alternative arrangement is shown for horizontal connection of flatpacks to a parent board 70 having a mounting plate 72 as a common mechanical support for the parent RF interconnecting board and the flat packages. This arrangement is preferred when significant heat is generated in the operated circuits, since the bottom of the package can be mounted against a heat sink. In FIGS. 6 and 7, the microwave connecting edge of planar spacer 20 is shown in contact with the parent board. Electrical connections can be made with small metal strips soldered or brazed in a known manner. The opposite end of the package provides access for edge mount connectors to the DC or bias leads 32.

Figure 8:
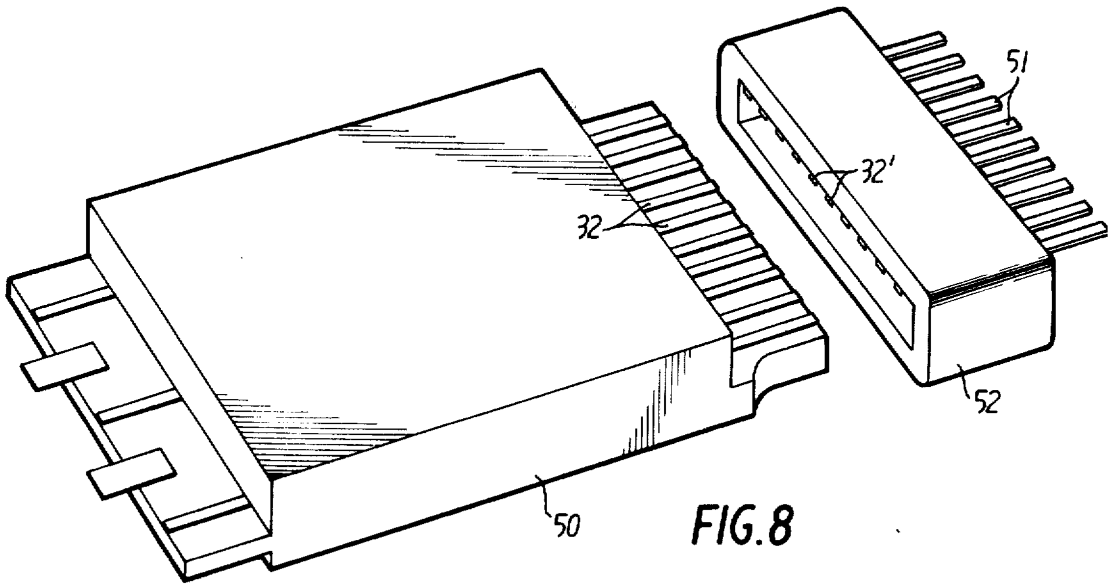
FIG. 8 is an isometric representation of a flat package in accordance with the invention in association with an illustrative edge connector for connecting to the DC leads.

FIG. 8 is an isometric view of a schematic representation of a package in accordance with the invention, generally as shown at 50 for connection with an edge card connector shown at 52. The connector 52 includes electrical contacts, end surfaces of which are seen at 32', which are positioned to align with and make electrical connection to the leads 32 of the package 50. 54 illustrates the electrical leads associated with the connectors 32'. It is to be understood that the connector 52 is conventional type.

MANUFACTURING PROCESSES

Flat packages according to this invention can be made from dielectric materials obtained by firing ceramic/organic films cut to predetermined shape and dimensions. A suitable technique for making the various ceramic components of the package is the so-called "green tape" process. In this process flat dielectric substrates with a smooth surface finish suitable for metallizing can be produced. A pliable tape or film of ceramic in an organic polymer binder is cast and cut to shape before firing. Careful casting can provide alumina ceramic dielectric shapes having a density up to about 96 percent of theoretical density of the alumina. Excellent surface finish is obtained by this process.

The casting method usually employs a doctor blade in which a sheet or tape of ceramic and binder is case onto a flat surface. After evaporation of a solvent or liquid carrier, a flexible "green" tape is obtained which can be cut or punched with the desired configuration of periphery and cutouts prior to firing. In discussing the invention, alumina is given as the preferred ceramic; however, other materials such as beryllia can be used. Sub-micron $Al_2O_3$ powders can be obtained by grinding commercial grade powder, such as Alcoa A–14 or A–16. A small amount of MgO powder (about 0.25 parts per 100 parts $Al_2O_3$) can be added to inhibit grain growth of the alumina during firing. A suitable organic binder, plasticizer and deflocculator are mixed with the milled alumina powder. A preferred binder is about 5–10 parts polyvinyl butyral per 100 parts ceramic solids. A plasticizer may be added in sufficient amount, usually about 75–200 parts per 100 parts polymer solids, to give a pliable sheet after casting and evaporation. About 50 parts toluene/ethanol solvent per 100 parts ceramic is suitable for obtaining the desired casting viscosity. Using known casting techniques, a thin film of ceramic/binder can be cast to give a surface finish after firing of 3 microinches CLA (center line average) or less.

It should be noted that the frame 40, being thicker than spacer 20, can be fabricated from a thicker cast sheet or may be made by laminating or fusing several thin sheets from the same pattern. Ordinarily, the various ceramic components are aligned vertically before firing and helf flat during the fusion step.

The firing can take place in air, hydrogen, vacuum or other environment at a temperature of about 1450°–1850°C for several hours to several days. A reducing atmosphere of 93% N and 7% H gives dense substrates; but, air firing is suitable for most circuit packages. The green tape can be held between flat ceramic surfaces during firing to prevent warpage. Linear shrinkage of about 17–25 percent occurs during firing; however, these amounts are controllable and design of the pre-fired shape to accommodate shrinkage is practical. The fired substrates vary from about 0.0005 to 0.125 inches in thickness, with 0.025 to 0.10 being preferred for microwave packages. Flatpacks up to 6 inches in length are obtainable using this method for manufacturing the dielectric substrates.

The ceramic layers comprising the base, spacer and frame are effectively fused into an integral structure during firing when the separate pieces are held in close contact during the firing.

In making flatpacks according to the present invention, it is advantageous to metallize parts of the ceramic surfaces before firing. For instance, if metal leads 24 and 32 are to be obtained between base 10, spacer 20 and frame 40, which are bonded together during firing by the "green tape" process, the metal is applied before firing. Therefore, the metal films are required to withstand firing temperatures of about 1450°C to 1850°C. Inner metal films located between fired ceramic pieces may be made from W, Ta, Mo, Pt or Pd. A commercially-available (du Pont) Pt-Pd paste is suitable for curing by air firing. It is preferred that metal films 12, 24 and 32 be applied before firing. Metal films can be applied with screening techniques well-known in the electronics industry, used for "thick film" circuits. A stencil is made using a photopolymer on a thin mesh screen. The metallizing paste is then forced through the screen by a squeegee, depositing the paste only in the areas desired. The paste is then dried and fired to cure the film. Other metallized areas, such as areas 25 and 46, may be added subsequent to the firing, which fuses the ceramic pieces together. This can be accomplished by several known methods. Metal may be applied to desired portions of the ceramic surface by stencil technique. A metallic paint can be applied and fired to leave a metal film. Metal can be applied by vacuum deposition through a mask. Other deposition methods include cathode sputtering and electroless deposition of metal from aqueous solution. Typical electrically conductive metals for use herein include silver, gold, copper and tantalum. Aluminum may also be used in some low temperature applications for microwave circuits. Metal films ranging in thickness from several hundred to several thousand Angstrom units are suitable for use herein. For simplicity in manufacturing, it is preferred to perform initial metallizing step before firing. Optionally, portions of the metal films may be electroplated with a good electrical conductor, i.e. -gold or nickel, to provide a high conductivity surface area that is corrosion resistant bondable or solderable, as well as having a finished surface appearance.

An electrical circuit board can be connected to the RF, DC or bias leads by inserting a thin metal interconnector piece, such as gold strip, over the space between the circuit board and the edge of the spacer. The electrical connection can be completed by soldering or other suitable bonding technique. The electrical circuit board is mechanically fastened in place by soldering to metallized area 12, which also connects the ground plane of the circuit board to the ground plane of the package.

While the invention has been described by specific examples, there is no intent to limit the inventive concept except as set forth in the following claims.

What is claimed is:

1. An hermetically sealed flat package housing a microwave circuit board comprising:

a thin, planar base of dielectric material having a metal layer on a central portion of a first planar surface thereof;

a thin planar spacer of dielectric material having a peripheral shape generally corresponding to said planar base and having a central portion and first and second terminal end portions extending from said central portion, said central portion having a cut-out extending between the said first planar surface and the opposite, second planar surface of said spacer for exposing said metal layer of said planar base through said cut-out, said first terminal end portion extending outwardly from said base and including on said second planar surface a first plurality of electrically conductive metal film connector leads extending from the cut-out of said central portion to the outer edge of said first terminal end portion and at least one metal film on said first planar surface disposed to underlie and provide a ground plane for each of said first plurality of metal film connector leads whereby each of said metal film connector leads of said first terminal end portion comprises a microstrip transmission line, and said second end portion of said spacer having a second plurality of electrically conductive metal film leads thereon extending from said cut-out to an outer edge of said second terminal end portion;

said spacer being bonded on a first planar surface thereof to said first planar surface of said base, with said cut-out of said central portion aligned with said metal layer of said base and with said metal film of said first planar surface of said first terminal end portion in mechanical and electrical contact with said metal layer of said base;

a planar frame having a thickness substantially greater than that of said spacer and having a cut-out larger than said cut-out of said spacer, said planar frame being bonded to said spacer with the respective cut-outs thereof in alignment exposing within said cut-out of said frame, portions of said first and second pluralities of said connector leads adjacent said cut-out of said planar spacer;

a circuit board received within said cut-outs of said planar frame and of said planar spacer and mounted on said metal layer of said planar base, said circuit board having a first plurality of microstrip connector leads thereon and a second plurality of low frequency connector leads thereon, said first plurality of connector leads of said first terminal end portion being connected to said first plurality of microstrip connector leads of said circuit board and said second plurality of connector leads of said second terminal end portion being connected to said second plurality of low frequency connector leads of said circuit board at the said portions thereof adjacent the cut-out of said central portion as exposed within said cut-out of said frame, and a planar metal top plate having a peripheral shape generally corresponding to said planar frame and bonded thereto hermetically sealing said circuit board within said package.

2. The package of claim 1, including at least one metal tab bonded to the package on the first terminal end portion, and adapted for mechanically attaching the package to another structure.

3. The package of claim 1, wherein the dielectric material is selected from the group consisting of alumina and beryllia.

4. A package as recited in claim 1, wherein the interior edges of said spacer surrounding said cut-out portion thereof include at least one recess for facilitating access to and removal of said circuit board.

5. A rectangular package according to claim 1, wherein the cutout portions of the spacer and frame are substantially rectangular.

6. A package according to claim 1, wherein the base, spacer and frame comprise ceramic dielectric material.

7. A package according to claim 6, wherein the dielectric material consists essentially of alumina.

8. A package as recited in claim 1 wherein said metal layer of said base is larger in dimensions than the dimensions of said cut-out of said spacer and in electrical contact with said metal layer on said first planar surface of said spacer.

9. A package as recited in claim 1 wherein said first and second terminal end portions extend in opposite, longitudinal directions from said central portion of said spacer.

10. A package as recited in claim 1 wherein said second terminal end portion further includes at least one metal mounting tab bonded on one of said planar surfaces thereof and extending beyond said outer edge of said end portion.

11. A microwave assembly having a parent board and at least one hermetically sealed flat package housing a microwave circuit board, each said package comprising:

a thin, planar base of dielectric material having a metal layer on a central portion of a first planar surface thereof;

a thin planar spacer of dielectric material having a peripheral shape generally corresponding to said planar base and having a central portion and first and second terminal end portions extending from said central portion, said central portion having a cut-out extending between the said first planar surface and the opposite, second planar surface of said spacer for exposing said metal layer of said planar base through said cut-out, said first terminal end portion extending outwardly from said base and including on said second planar surface a first plurality of electrically conductive metal film connector leads extending from the cut-out of said central portion to the outer edge of said first terminal end portion and at least one metal film on said first planar surface disposed to underlie and provide a ground plane for each of said first plurality of metal film connector leads whereby each of said metal film connector leads of said first terminal end portion comprises a microstrip transmission line, and said second end portion of said spacer having a second plurality of electrically conductive metal film leads thereon extending from said cut-out to an outer edge of said second terminal end portion;

said spacer being bonded on a first planar surface thereof to said first planar surface of said base, with said cut-out of said central portion aligned with said metal layer of said base and with said metal film of said first planar surface of said first terminal end portion in mechanical and electrical contact with said metal layer of said base;

a planar frame having a thickness substantially greater than that of said spacer and having a cut-out larger than said cut-out of said spacer, said planar frame being bonded to said spacer with the respective cut-outs thereof in alignment exposing within said cut-out of said frame portions of said first and second pluralities of said connector leads adjacent said cut-out of said planar spacer;

a circuit board received within said cut-outs of said planar frame and of said planar spacer and mounted on said metal layer of said planar base, said circuit board having a first plurality of microstrip connector leads thereon and a second plurality of low frequency connector leads thereon, said first plurality of connector leads of said first terminal end portion being connected to said first plurality of microstrip connector leads of said circuit board and said second plurality of connector leads of said second terminal end portion being connected to said second plurality of low frequency connector leads of said circuit board at the said portions thereof adjacent the cut-out of said central portion as exposed within said cut-out of said frame, and a planar metal top plate having a peripheral shape generally corresponding to said planar frame and bonded thereto hermetically sealing said circuit board within said package, and wherein said parent board includes microstrip transmission lines disposed to correspond in location to said microstrip transmission lines of said first terminal end portion, said package being mounted on said parent board with said microstrip transmission lines of said first terminal end portion thereof in electrical contact with said microstrip transmission lines of said parent board.

12. A microwave assembly as recited in claim 11 including plural said packages disposed with said bases thereof in a common plane and with said first terminal end portions thereof in alignment and wherein said parent board includes plural groups of microstrip transmission lines, each said group disposed to correspond to, and being electrically connected to, the first plurality of microstrip transmission lines of said first terminal end portion of a corresponding package.

13. A microwave assembly as recited in claim 11 wherein there is further provided an edge connector for receiving said second terminal end portion and including connector leads disposed to correspond to said second plurality of connector leads of said second terminal end portion and electrically connected thereto.

14. A microwave assembly as recited in claim 11 wherein there is provided a plurality of said packages disposed in parallel spaced planes with said edges of said second terminal end portions thereof disposed in a common plane and in alignment and wherein said parent board includes a plurality of parallel longitudinally extending microstrip transmission lines respectively corresponding to said first plurality of microstrip transmission lines of said first terminal end portions of said aligned packages and said first plurality of microstrip transmission lines of said first terminal end portion of each said package is selectively connected to said corresponding, parallel longitudinally extending microstrip transmission lines of said parent board.

15. A microwave assembly as recited in claim 14 wherein said second terminal end portion of each said package includes at least one metal mounting tab bonded on one of said planar surfaces of said second terminal end portion and extending beyond said outer edge thereof and connected to said parent board thereby mounting each said package to said parent board.

* * * * *